United States Patent
Yasui et al.

(10) Patent No.: US 10,989,955 B2
(45) Date of Patent: Apr. 27, 2021

(54) LIQUID CRYSTAL DISPLAY DEVICE

(71) Applicants: Panasonic Liquid Crystal Display Co., Ltd., Himeji (JP); Pasona Knowledge Partner Inc., Osaka (JP)

(72) Inventors: Yoichi Yasui, Osaka (JP); Takenori Yaguchi, Hyogo (JP); Takaaki Kitada, Chiba (JP); Kazuhiko Tsuda, Hyogo (JP); Takashi Kato, Hyogo (JP); Hidenori Kikuchi, Hyogo (JP); Naoki Terasawa, Hyogo (JP); Katsuji Tanaka, Hyogo (JP)

(73) Assignees: Panasonic Liquid Crystal Display Co., Ltd., Himeji (JP); Pasona Knowledge Partner Inc., Osaka (JP)

( * ) Notice: Subject to any disclaimer, the term of this patent is extended or adjusted under 35 U.S.C. 154(b) by 0 days.

(21) Appl. No.: 16/859,606

(22) Filed: Apr. 27, 2020

(65) Prior Publication Data
US 2020/0257165 A1    Aug. 13, 2020

Related U.S. Application Data

(63) Continuation of application No. 16/436,298, filed on Jun. 10, 2019, now Pat. No. 10,670,912, which is a
(Continued)

(30) Foreign Application Priority Data

Mar. 30, 2017    (JP) ............................. JP2017-068347

(51) Int. Cl.
*G02F 1/1335*    (2006.01)
*H01L 27/12*    (2006.01)
(Continued)

(52) U.S. Cl.
CPC ...... *G02F 1/133528* (2013.01); *G02F 1/1347* (2013.01); *H01L 27/1218* (2013.01);
(Continued)

(58) Field of Classification Search
CPC .................................................. G02F 1/133528
See application file for complete search history.

(56) References Cited

U.S. PATENT DOCUMENTS

| | | | |
|---|---|---|---|
| 2009/0027592 A1 | 1/2009 | Motomatsu | |
| 2009/0147186 A1* | 6/2009 | Nakai | .................. G09G 3/3406 349/74 |

(Continued)

FOREIGN PATENT DOCUMENTS

| | | |
|---|---|---|
| JP | 2001-091926 | 4/2001 |
| JP | 2008-065079 | 3/2008 |

(Continued)

OTHER PUBLICATIONS

Office Action issued in Japanese Patent Application No. 2017-068347, dated Sep. 1, 2020, 6 pages.

*Primary Examiner* — Edmond C Lau
(74) *Attorney, Agent, or Firm* — Hamre, Schumann, Mueller & Larson, P.C.

(57) ABSTRACT

A liquid crystal display device includes a first glass substrate, a second glass substrate, a first liquid crystal layer disposed between the first glass substrate and the second glass substrate, a third glass substrate, a fourth glass substrate, a second liquid crystal layer disposed between the third glass substrate and the fourth glass substrate, a first polarizing plate formed on the first glass substrate, a second polarizing plate formed on the third glass substrate, and a bonding layer disposed between the first glass substrate and the third glass substrate. In planar view, the bonding layer is disposed outside the first polarizing plate and the second polarizing plate, a surface on the bonding layer bonds to the
(Continued)

first glass substrate, and a surface on the bonding layer bonds to the third glass substrate.

16 Claims, 15 Drawing Sheets

Related U.S. Application Data continuation of application No. 15/940,475, filed on Mar. 29, 2018, now Pat. No. 10,359,665.

(51) Int. Cl.
*G02F 1/1347* (2006.01)
*G02F 1/1362* (2006.01)
*G02F 1/1333* (2006.01)

(52) U.S. Cl.
CPC .. *G02F 1/133512* (2013.01); *G02F 1/136286* (2013.01); *G02F 2001/133388* (2013.01); *G02F 2201/121* (2013.01); *G02F 2201/123* (2013.01); *H01L 27/124* (2013.01)

(56) References Cited

U.S. PATENT DOCUMENTS

| 2010/0110326 | A1  | 5/2010  | Isobe |
|---|---|---|---|
| 2016/0170702 | A1* | 6/2016 | Jiang ................. G02F 1/133528 345/618 |
| 2016/0172346 | A1* | 6/2016 | Koresawa ......... G02F 1/133305 257/99 |
| 2017/0343839 | A1* | 11/2017 | Nam .................... G09G 3/3406 |

FOREIGN PATENT DOCUMENTS

| JP | 2009-031432 | 2/2009 |
| JP | 2010-066353 | 3/2010 |
| JP | 2011-164185 | 8/2011 |
| JP | 2017-049324 | 3/2017 |
| WO | 2008/142817 | 11/2008 |

* cited by examiner

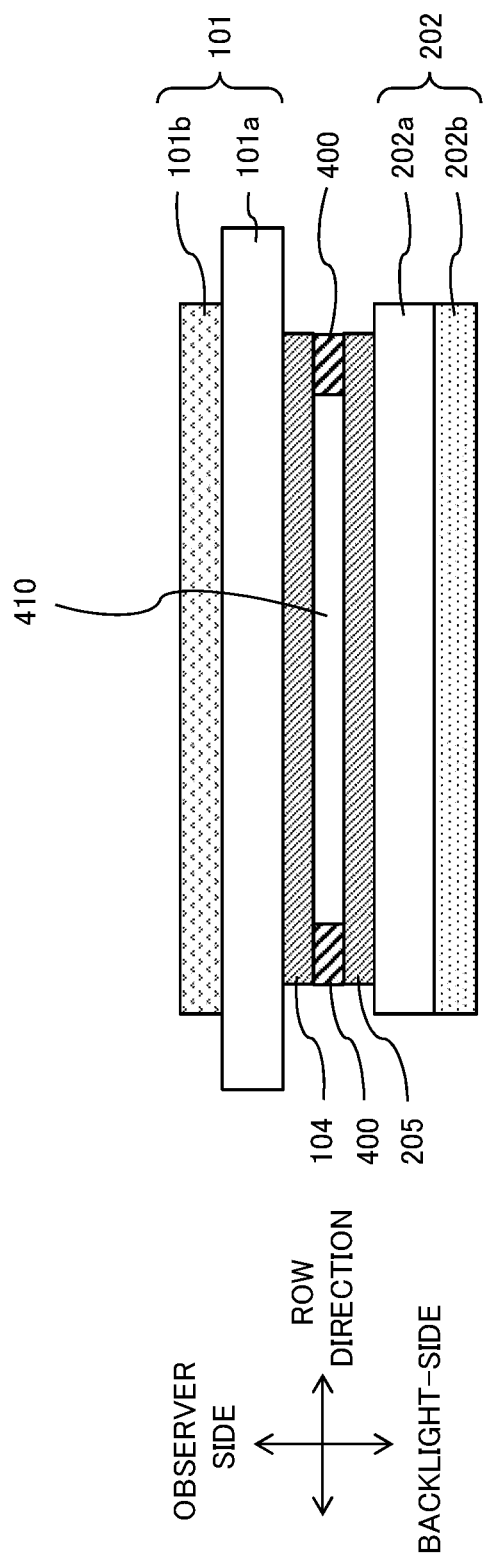

LIQUID CRYSTAL DISPLAY DEVICE

CROSS-REFERENCE TO RELATED APPLICATION

The present application claims priority from Japanese application JP 2017-068347 filed on Mar. 30, 2017, the content of which is hereby incorporated by reference into this application.

TECHNICAL FIELD

The present invention relates to a liquid crystal display device.

BACKGROUND

A technique, in which two display panels overlap each other and an image is displayed on each display panel based on an input video signal, has been conventionally proposed to improve contrast of a liquid crystal display device (for example, see Unexamined Japanese Patent Publication No. 2010-66353). Specifically, for example, a color image is displayed on a front-side (observer-side) display panel in two display panels disposed back and forth, and a black-and-white image is displayed on a rear-side (backlight-side) display panel, thereby improving contrast.

In the conventional liquid crystal display device, the two display panels are stuck and fixed using a bonding agent, such as a UV curable resin, which is applied onto whole surfaces opposite to each other in the two display panels. However, in the configuration of the conventional liquid crystal display device, it is necessary to apply the bonding agent onto the whole surfaces of the two display panels, which results in a cost increase.

An object of the present disclosure is to reduce the cost of the liquid crystal display device in which the plurality of display panels overlap each other.

SUMMARY

According to one aspect of the present disclosure, a liquid crystal display device in which a plurality of display panels are disposed while overlapping each other, and an image being displayed on each of the display panels, the liquid crystal display device includes: a first glass substrate; a second glass substrate disposed opposite to a first direction with respect to the first glass substrate; a first liquid crystal layer disposed between the first glass substrate and the second glass substrate; a third glass substrate disposed opposite to the first glass substrate in a second direction, the second direction being an opposite direction to the first direction with respect to the first glass substrate; a fourth glass substrate disposed opposite to the second direction with respect to the third glass substrate; a second liquid crystal layer disposed between the third glass substrate and the fourth glass substrate; a first polarizing plate formed in a first surface on a second direction side of the first glass substrate; a second polarizing plate formed in a first surface on a first direction side of the third glass substrate; and an bonding layer disposed between the first glass substrate and the third glass substrate. In planar view, the bonding layer is disposed outside the first polarizing plate and the second polarizing plate, a surface on the first direction side of the bonding layer bonds to the first surface of the first glass substrate, and a surface on the second direction side of the bonding layer bonds to the first surface of the third glass substrate.

According to another aspect of the present disclosure, a liquid crystal display device in which a plurality of display panels are disposed while overlapping each other, and an image being displayed on each of the display panels, the liquid crystal display device includes: a first glass substrate; a second glass substrate disposed opposite to a first direction with respect to the first glass substrate; a first liquid crystal layer disposed between the first glass substrate and the second glass substrate; a third glass substrate disposed opposite to the first glass substrate in a second direction, the second direction being an opposite direction to the first direction with respect to the first glass substrate; a fourth glass substrate disposed opposite to the second direction with respect to the third glass substrate; a second liquid crystal layer disposed between the third glass substrate and the fourth glass substrate; a first polarizing plate formed in a first surface on a second direction side of the first glass substrate; a second polarizing plate formed in a first surface on a first direction side of the third glass substrate; and an bonding layer disposed between the first polarizing plate and the second polarizing plate. In planar view, the bonding layer overlaps outer peripheral ends of the first polarizing plate and the second polarizing plate, a surface on the first direction side of the bonding layer bonds to a surface on the second direction side of the first polarizing plate, and a surface on the second direction side of the bonding layer bonds to a surface on the first direction side of the second polarizing plate.

In the liquid crystal display device, a thickness of the bonding layer may be larger than a total of thicknesses of the first polarizing plate and the second polarizing plate.

In the liquid crystal display device, surface roughening may be performed on at least one of a surface on the second direction side of the first polarizing plate and a surface on the first direction side of the second polarizing plate.

In the liquid crystal display device, a gap may be formed in a region between the first polarizing plate and the second polarizing plate.

In the liquid crystal display device, the bonding layer may include a first portion and a second portion having weaker adhesive strength than the first portion.

In the liquid crystal display device, an opening may be formed in a part of the bonding layer.

In the liquid crystal display device, the bonding layer may include a first portion disposed along a side where a driving circuit is disposed and a second portion disposed opposite to the first portion, and the opening may be formed in the first portion and the second portion.

In the liquid crystal display device, each of the display panels may include a chip on film (COF) portion, and the bonding layer may be disposed in a region where the COF portion is avoided in planar view.

The present disclosure can reduce the cost of the liquid crystal display device in which the plurality of display panels overlap each other.

BRIEF DESCRIPTION OF THE DRAWINGS

FIG. 7 is a view illustrating a stuck portion of display panel 100 and display panel 200 of the first exemplary embodiment;

DETAILED DESCRIPTION

Hereinafter, an exemplary embodiment of the present disclosure will be described with reference to the drawings. A liquid crystal display device according to the present exemplary embodiment includes a plurality of display panels that display images, a plurality of driving circuits (a plurality of source drivers and a plurality of gate drivers) that drive the display panels, a plurality of timing controllers that control the driving circuits, an image processor that performs image processing on input image data input from an outside and outputs image data to each of the timing controllers, and a backlight that irradiates the plurality of display panels with light from a rear surface side. There is no limitation to a number of display panels, but it is only necessary to provide at least two display panels. When viewed from an observer side, the plurality of display panels are disposed while overlapping each other in a front-back direction. An image is displayed on each of the display panels. Liquid crystal display device 10 including two display panels will be described below by way of example.

First Exemplary Embodiment

Figure 1:
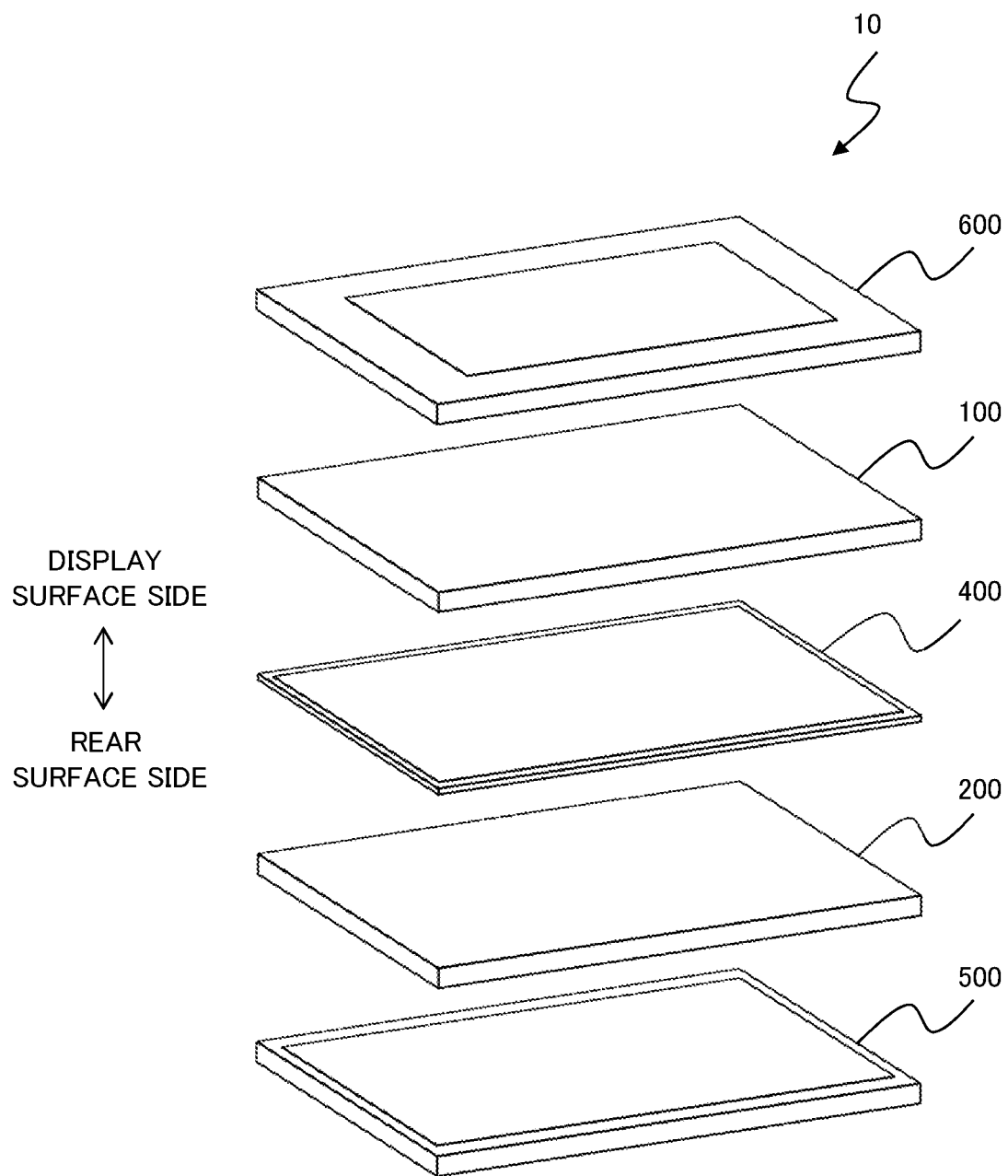
FIG. 1 is a perspective view illustrating a schematic configuration of liquid crystal display device of a first exemplary embodiment.

FIG. 1 is a perspective view illustrating a schematic configuration of liquid crystal display device 10 of a first exemplary embodiment. As illustrated in FIG. 1, liquid crystal display device 10 includes display panel 100 disposed at a position (front side) closer to an observer, display panel 200 disposed at a position (rear side) farther away from the observer with respect to display panel 100, adhesive layer 400 in which display panel 100 and display panel 200 adhere to each other, backlight 500 disposed on the rear surface side of display panel 200, and front chassis 600 that covers display panel 100 and display panel 200 from the display surface side.

Figure 2:
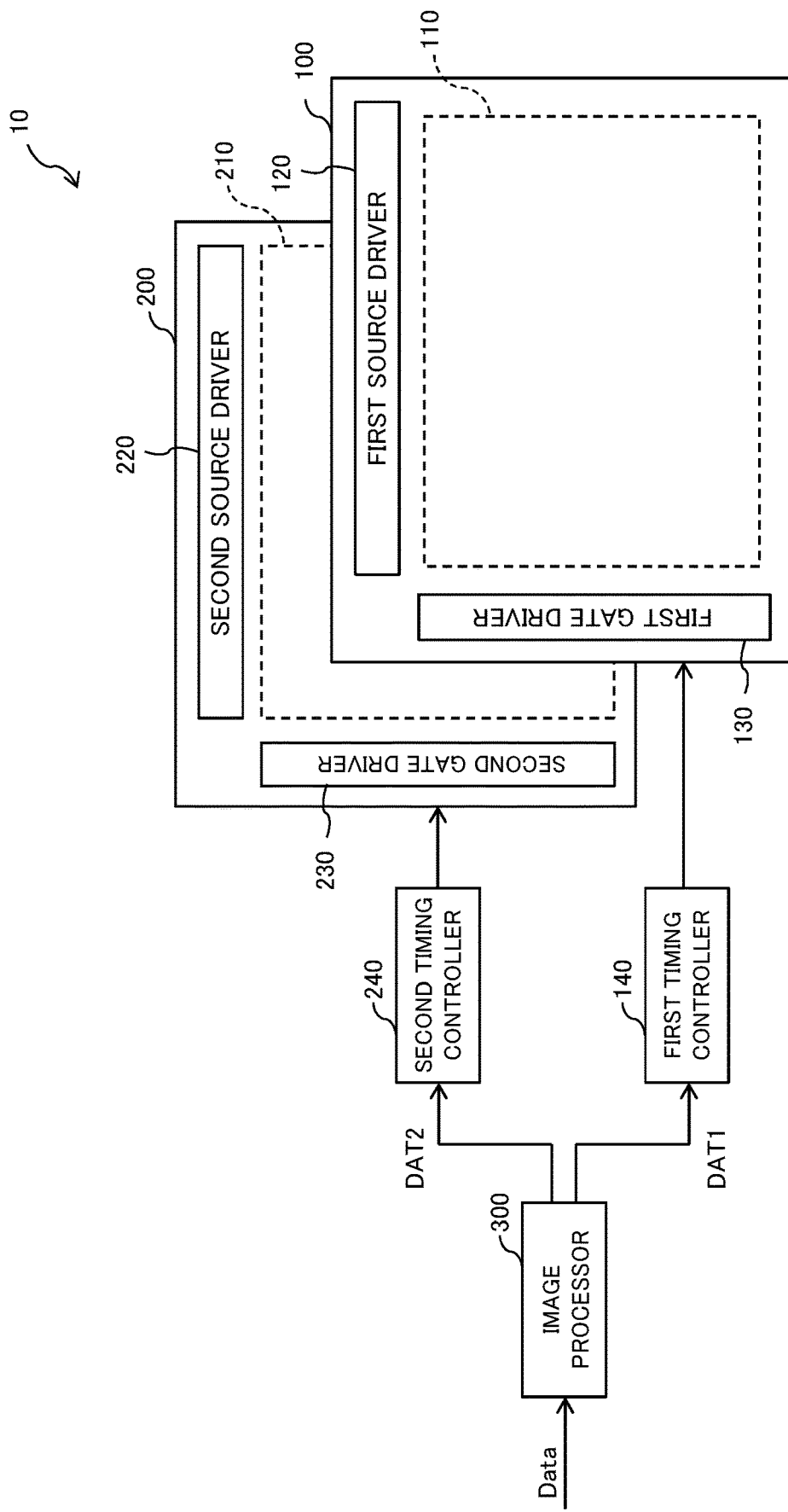
FIG. 2 is a plan view illustrating a schematic configuration of liquid crystal display device according to the first exemplary embodiment.

FIG. 2 is a plan view illustrating a schematic configuration of liquid crystal display device 10 according to the first exemplary embodiment. As illustrated in FIG. 2, display panel 100 includes first source driver 120 and first gate driver 130, and display panel 200 includes second source driver 220 and second gate driver 230. Liquid crystal display device 10 includes first timing controller 140 that controls first source driver 120 and first gate driver 130, second timing controller 240 that controls second source driver 220 and second gate driver 230, and image processor 300 that outputs image data to first timing controller 140 and second timing controller 240. For example, display panel 100 displays a color image in first image display region 110 according to the input video signal, and display panel 200 displays a black-and-white image in second image display region 210 according to the input video signal. Image processor 300 receives input video signal Data transmitted from an external system (not illustrated), performs predetermined image processing on input video signal Data, outputs first image data DAT1 to first timing controller 140, and outputs second image data DAT2 to second timing controller 240. Image processor 300 also outputs control signals CS1, CS2 (see FIGS. 3 and 4) such as a synchronizing signal to first timing controller 140 and second timing controller 240. First image data DAT1 is image data for displaying the color image, and second image data DAT2 is image data for displaying the black-and-white image. Display panel 100 may display the black-and-white image while display panel 200 displays the color image, or both display panels 100, 200 may display the black-and-white image or the color image.

Figure 3:
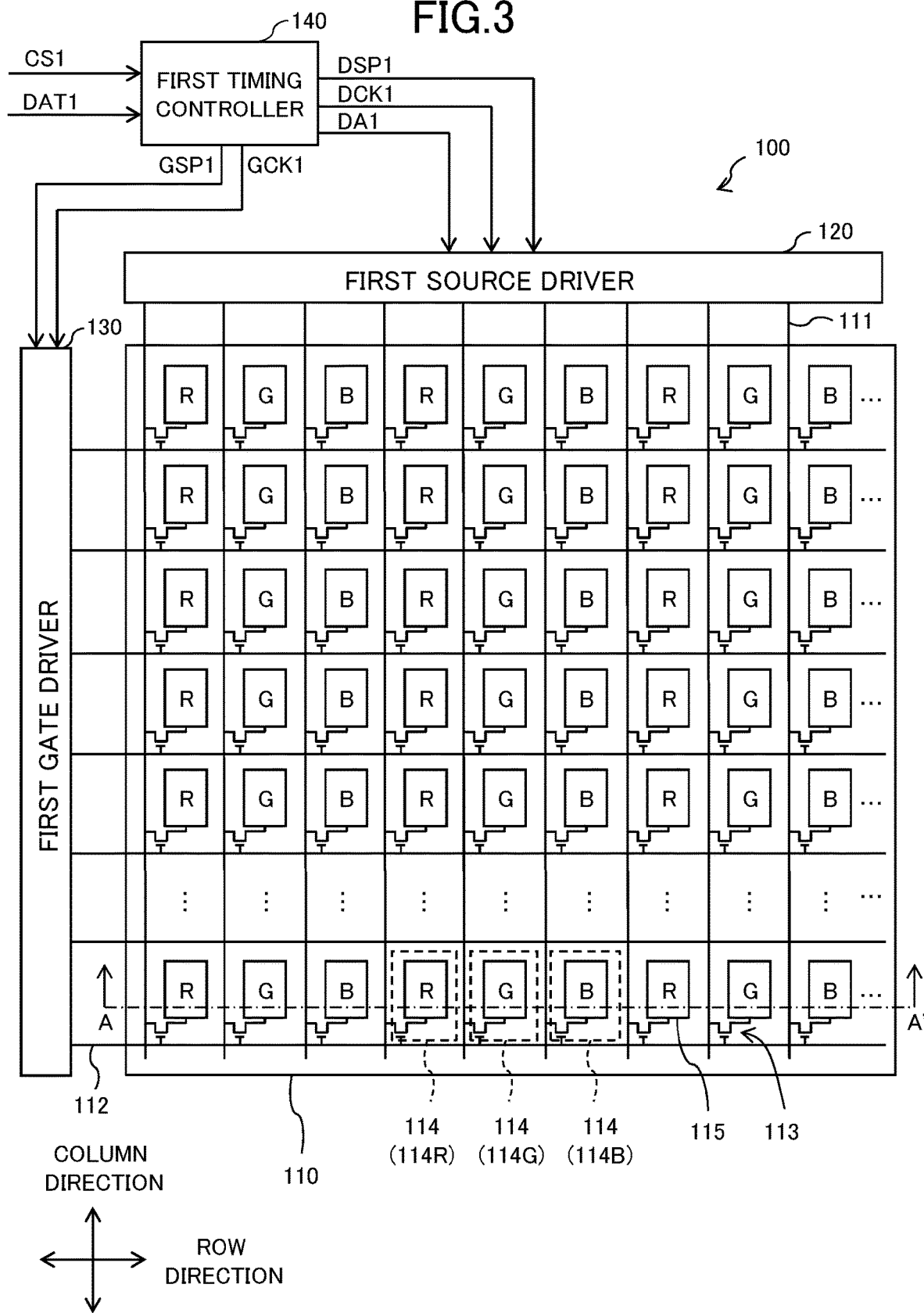
FIG. 3 is a plan view illustrating a schematic configuration of display panel.
Figure 4:
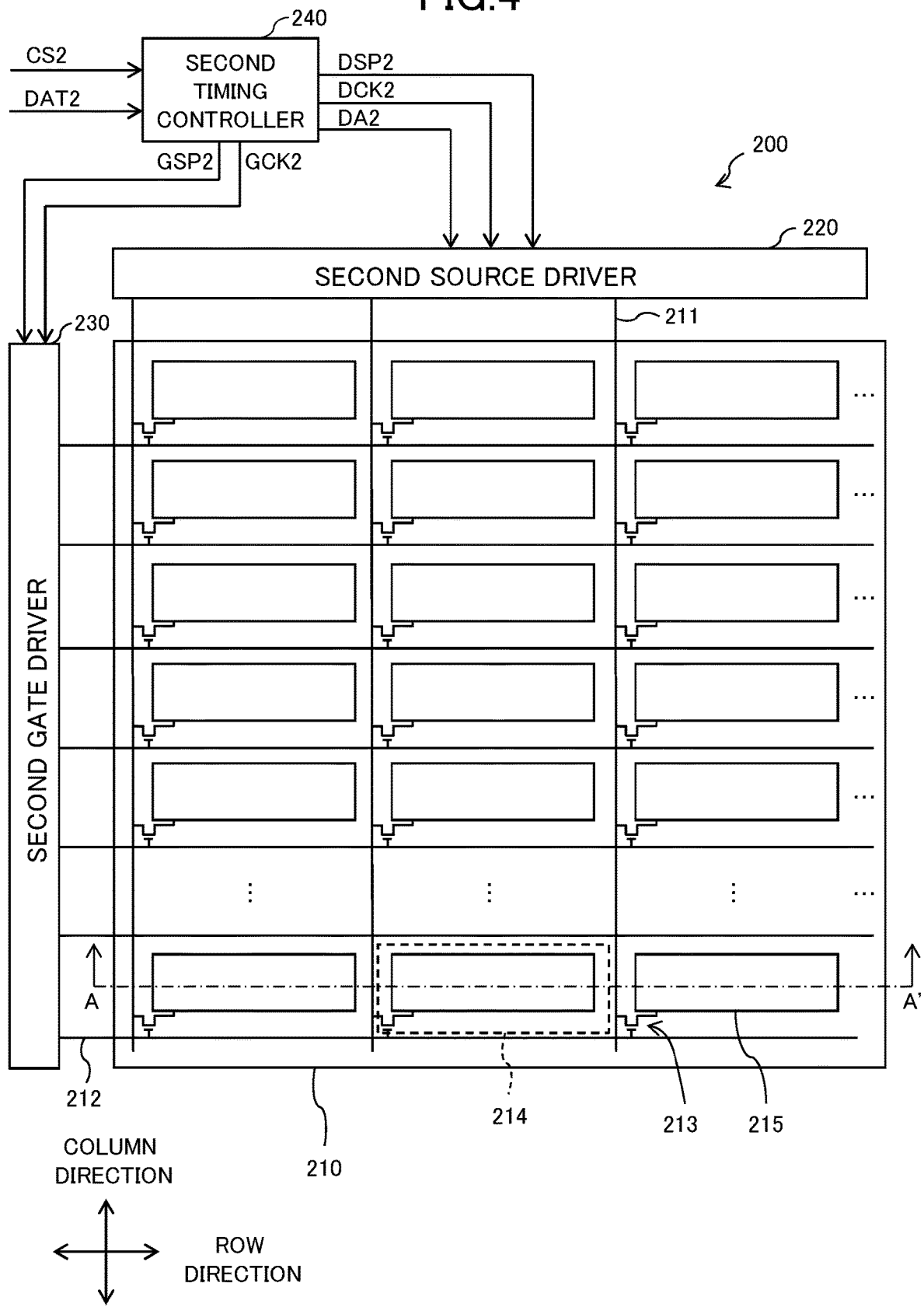
FIG. 4 is a plan view illustrating a schematic configuration of display panel.
Figure 5:
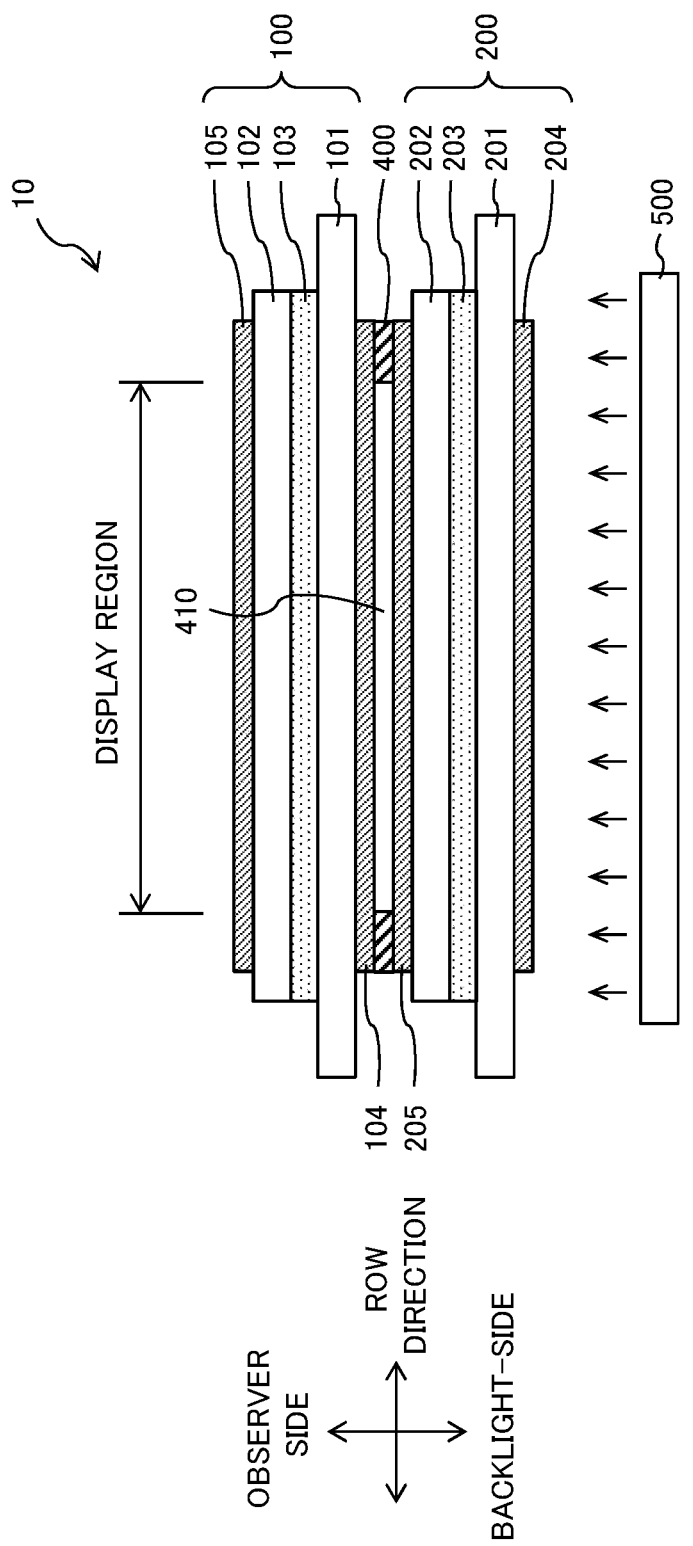
FIG. 5 is a sectional view taken along line A-A' in FIGS. 3 and 4.

FIG. 3 is a plan view illustrating a schematic configuration of display panel 100, and FIG. 4 is a plan view illustrating a schematic configuration of display panel 200. FIG. 5 is a sectional view taken along line A-A' in FIGS. 3 and 4.

A configuration of display panel 100 will be described with reference to FIGS. 3 and 5. As illustrated in FIG. 5, display panel 100 includes thin film transistor substrate 101 disposed on a side (second direction side) of backlight 500, counter substrate 102, which is disposed on the observer side (first direction side) while being opposite to thin film transistor substrate 101, and liquid crystal layer 103 disposed between thin film transistor substrate 101 and counter substrate 102. Polarizing plate 104 is disposed on the side of backlight 500 of display panel 100, and polarizing plate 105 is disposed on the observer side.

In thin film transistor substrate 101, as illustrated in FIG. 3, a plurality of source lines 111 extending in a column direction, and a plurality of gate lines 112 extending in a row direction are formed, and thin film transistor 113 is formed near an intersection between each of the plurality of source lines 111 and each of the plurality of gate lines 112. In planar view of display panel 100, a region surrounded by two source lines 111 adjacent to each other and two gate lines 112 adjacent to each other is defined as one pixel 114, and a plurality of pixels 114 are arranged in a matrix form (the row direction and the column direction). In thin film transistor substrate 101, pixel electrode 115 is formed in each pixel 114, and one common electrode (not illustrated) common to the plurality of pixels 114 is formed.

Although not illustrated, a plurality of colored portions each of which corresponds to pixel 114 are formed on counter substrate 102. Each colored portion is surrounded by black matrix blocking light transmission. For example, each colored portion is formed into a rectangular shape. The plurality of colored portions include red portions made of a red (R color) material to transmit red light, green portions made of a green (G color) material to transmit green light, and blue portions made of a blue (B color) material to transmit blue light. One of the red portions, one of the green portions, and one of the blue portions are repeatedly arranged in this order in the row direction, the colored portions having the same color are arranged in the column direction, and black matrices are formed in boundaries of colored portions adjacent in the row direction and the column direction. According to colored portions, the plurality of pixels 114 include red pixels 114R corresponding to the red portions, green pixels 114G corresponding to the green portions, and blue pixels 114B corresponding to the blue portions as illustrated in FIG. 3. In display panel 100, red pixels 114R, green pixels 114G, and blue pixels 114B are repeatedly arrayed in the row direction in this order, and pixels 114 having the identical color are arrayed in the column direction.

Based on first image data DAT1 and first control signal CS1 (such as a clock signal, a vertical synchronizing signal, and a horizontal synchronizing signal), which are received from image processor 300, first timing controller 140 generates first image data DA1 and first timing signals (data start pulse DSP1, data clock DCK1, gate start pulse GSP1, and gate clock GCK1) to control drive of first source driver 120 and first gate driver 130 (see FIG. 3). First timing controller 140 outputs first image data DA1, data start pulse DSP1, and data clock DCK1 to first source driver 120, and outputs gate start pulse GSP1 and gate clock GCK1 to first gate driver 130.

First source driver 120 outputs a data signal (data voltage, gradation voltage) corresponding to first image data DA1 to source lines 111 based on data start pulse DSP1 and data clock DCK1. First gate driver 130 outputs a gate signal (gate voltage) to gate lines 112 based on gate start pulse GSP1 and gate clock GCK1. Consequently, in display panel 100, a color image is displayed by supply of a desired data voltage to source lines 111 connected to pixel electrode 115 of each of red pixel 114R, green pixel 114G, and blue pixel 114B.

A configuration of display panel 200 will be described below with reference to FIGS. 4 and 5. As illustrated in FIG. 5, display panel 200 includes thin film transistor substrate 201 disposed on the side of backlight 500, counter substrate 202, which is disposed on the observer side while being opposite to thin film transistor substrate 201, and liquid crystal layer 203 disposed between thin film transistor substrate 201 and counter substrate 202. Polarizing plate 204 is disposed on the side of backlight 500 of display panel 200, and polarizing plate 205 is disposed on the observer side.

In thin film transistor substrate 201, as illustrated in FIG. 4, a plurality of source lines 211 extending in the column direction, and a plurality of gate lines 212 extending in the row direction are formed, and thin film transistor 213 is formed near the intersection between each of the plurality of source lines 211 and each of the plurality of gate lines 212. In planar view of display panel 200, a region surrounded by two source lines 211 adjacent to each other and two gate lines 212 adjacent to each other is defined as one pixel 214, and a plurality of pixels 214 are arranged in a matrix form (the row direction and the column direction). In thin film transistor substrate 201, pixel electrode 215 is formed in each pixel 214, and one common electrode (not illustrated) common to the plurality of pixels 214 is formed.

Although not illustrated, in counter substrate 202, the black matrix blocking light transmission is formed at a position corresponding to a boundary of each pixel 214. The colored portion is not formed in a region surrounded by the black matrix. For example, an overcoat film is formed in the region.

Based on second image data DAT2 and second control signal CS2 (such as a clock signal, a vertical synchronizing signal, and a horizontal synchronizing signal), which are received from image processor 300, second timing controller 240 generates second image data DA2 and second timing signals (data start pulse DSP2, data clock DCK2, gate start pulse GSP2, and gate clock GCK2) to control drive of second source driver 220 and second gate driver 230 (see FIG. 4). Second timing controller 240 outputs second image data DA2, data start pulse DSP2, and data clock DCK2 to second source driver 220, and outputs gate start pulse GSP2 and gate clock GCK2 to second gate driver 230.

Second source driver 220 outputs the data voltage corresponding to second image data DA2 to source lines 211 based on data start pulse DSP2 and data clock DCK2. Second gate driver 230 outputs the gate voltage to gate lines 212 based on gate start pulse GSP2 and gate clock GCK2. Consequently, the black-and-white image is displayed on display panel 200.

Figure 6A:
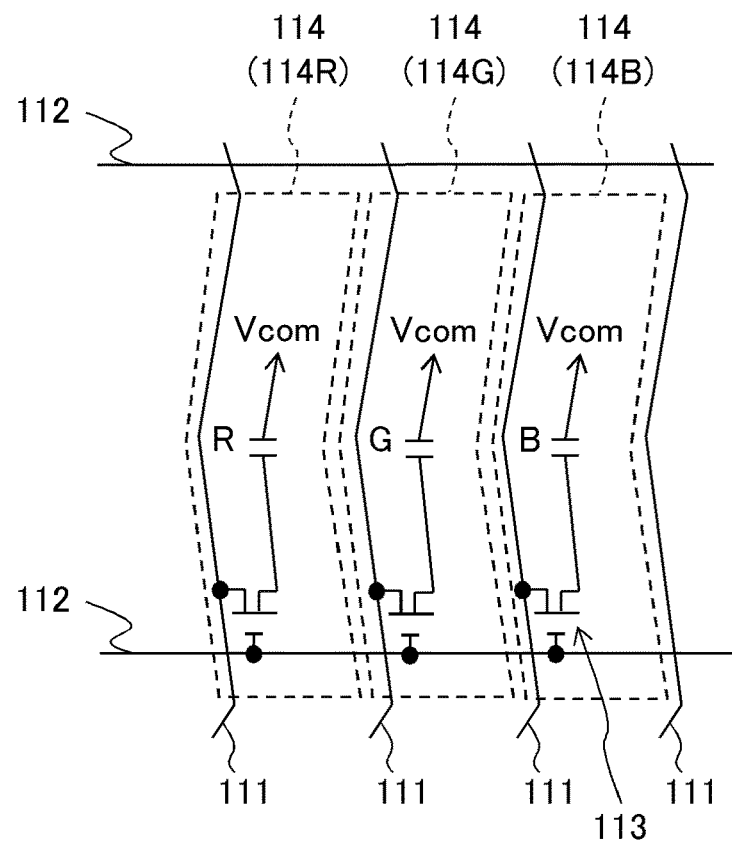
FIGS. 6A and 6B are plan views illustrating an exemplary pixel configuration of display panel 100 and display panel 200 of the first exemplary embodiment.
Figure 6B:
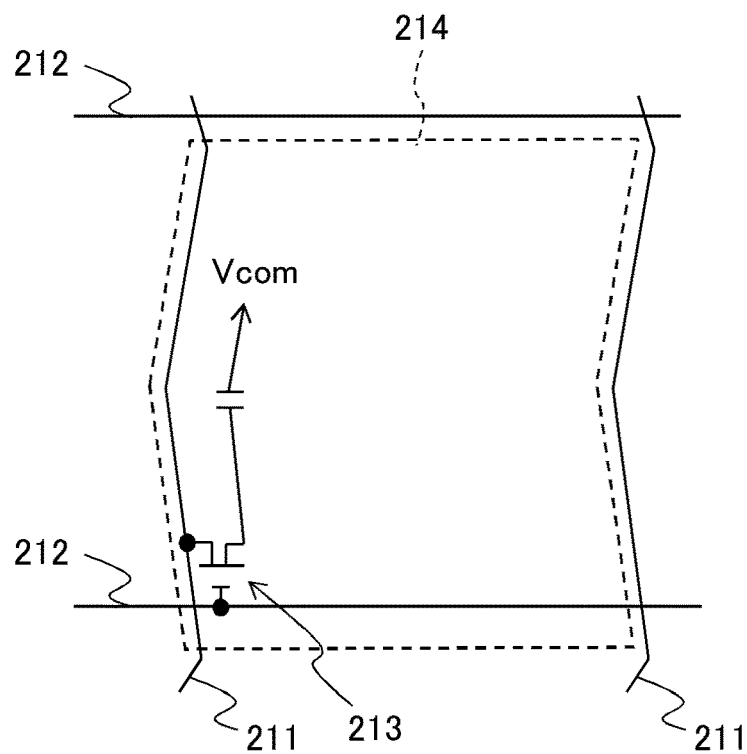

Each pixel 114 of display panel 100 and each pixel 214 of display panel 200 are disposed on three-to-one correspondence, and overlap each other in planar view. For example, as illustrated in FIGS. 6A and 6B, three pixels 114 (red pixel 114R, green pixel 114G, and blue pixel 114B) (see FIG. 6A) of display panel 100 and one pixel 214 (see FIG. 6B) of display panel 200 overlap each other in planar view. Each pixel 114 of display panel 100 and each pixel 214 of display panel 200 may be disposed in one-to-one correspondence, and one pixel 114 of display panel 100 and one pixel 214 of display panel 200 may overlap each other in planar view.

FIG. 7 is a view illustrating a stuck portion of display panel 100 and display panel 200 of the first exemplary embodiment. Thin film transistor substrate 101 of display panel 100 includes glass substrate 101a and TFT element layer 101b formed on a surface on the observer side of glass substrate 101a. TFT element layer 101b includes various components (such as source line 111, gate line 112, thin film transistor 113, pixel electrode 115, and a common electrode). Polarizing plate 104 is stuck to a surface on the backlight side of glass substrate 101a with an adhesive agent interposed therebetween. Counter substrate 202 of display panel 200 includes glass substrate 202a and CF element layer 202b formed on a surface on the backlight side of glass substrate 202a. CF element layer 202b includes various components (such as a color filter and the black matrix). Polarizing plate 205 is stuck to a surface on the observer side of glass substrate 202a with an adhesive agent interposed therebetween.

As illustrated in FIG. 7, display panel 100 and display panel 200 are stuck and fixed by bonding layer 400. For example, a double sided tape or a silicone resin based bonding agent can be used as bonding layer 400. Specifically, bonding layer 400 is disposed at an outer peripheral end between polarizing plate 104 of display panel 100 and polarizing plate 205 of display panel 200. That is, bonding layer 400 overlaps the outer peripheral ends of polarizing plate 104 and polarizing plate 205 in planar view. Air gap 410 (gap) is formed in a region surrounded by bonding layer 400. In a process of sticking display panel 100 and display panel 200, one of surfaces of the double sided tape (bonding layer 400) is stuck to the outer peripheral end of the surface on the observer side of polarizing plate 205 of display panel 200, and the other surface of the double sided tape is stuck to the outer peripheral end of the surface on the backlight side of polarizing plate 104 while display panel 100 is overlapped. Consequently, polarizing plates 104, 205 are stuck to each other with bonding layer 400 interposed therebetween, thereby fixing display panel 100 and display panel 200.

Figure 8:
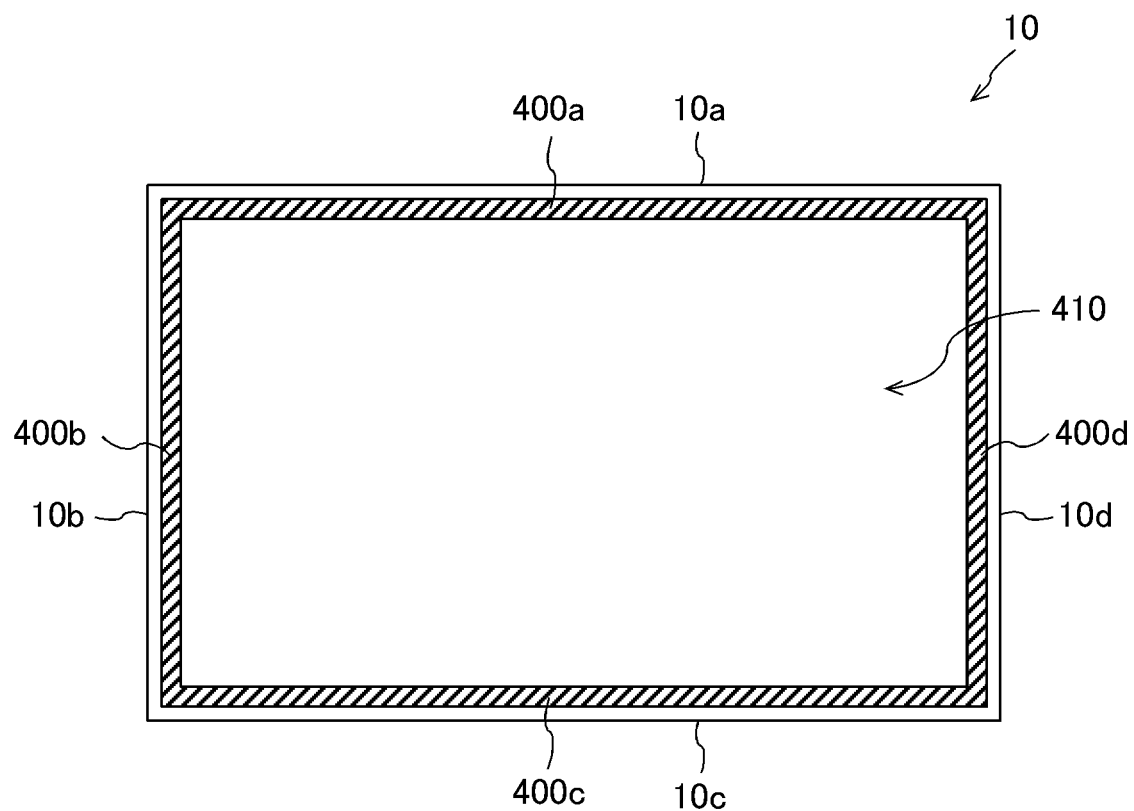
FIG. 8 illustrates disposition of bonding layer in planar view of liquid crystal display device.

FIG. 8 illustrates disposition of bonding layer 400 in planar view of liquid crystal display device 10. In FIG. 8, for convenience, only bonding layer 400 is illustrated while other components are eliminated. Bonding layer 400 includes first portion 400a, second portion 400b, third portion 400c, and fourth portion 400d each of which extends into a rectangular shape, first portion 400a is disposed along upper side 10a of liquid crystal display device 10, second portion 400b is disposed along left side 10b of liquid crystal display device 10, third portion 400c is disposed along lower side 10c of liquid crystal display device 10, and fourth portion 400d is disposed along right side 10d of liquid crystal display device 10. First portion 400a, second portion 400b, third portion 400c, and fourth portion 400d are disposed along an outer periphery of liquid crystal display device 10 while coupled to each other. Air gap 410 is formed in the region surrounded by bonding layer 400 (first portion 400a, second portion 400b, third portion 400c, and fourth portion 400d). As illustrated in FIGS. 7 and 8, air gap 410 is a closed space. In the case that the double sided tape is used as bonding layer 400, the coupling portion of first portion 400a, second portion 400b, third portion 400c, and fourth portion 400d may be separated in consideration of work efficiency.

In the above configuration, bonding layer 400 is disposed not in an inside region of liquid crystal display device 10 (polarizing plate) but at the outer peripheral end of liquid crystal display device 10, so that the cost can be reduced compared with the conventional configuration in which the bonding layer is disposed over the whole surface of the liquid crystal display device (polarizing plate). The closed space (air gap 410) is formed between display panel 100 and display panel 200, and air flowing into and out liquid crystal display device 10 is interrupted, so that mixing of foreign matters can be prevented.

Second Exemplary Embodiment

A second exemplary embodiment of the present disclosure will be described below with reference to the drawings. For convenience, the same component as that of the first exemplary embodiment is designated by the same numeral, and the description will be omitted. In the second exemplary embodiment, the term defined in the first exemplary embodiment is used according to the definition of the first exemplary embodiment unless otherwise noted.

Figure 9:
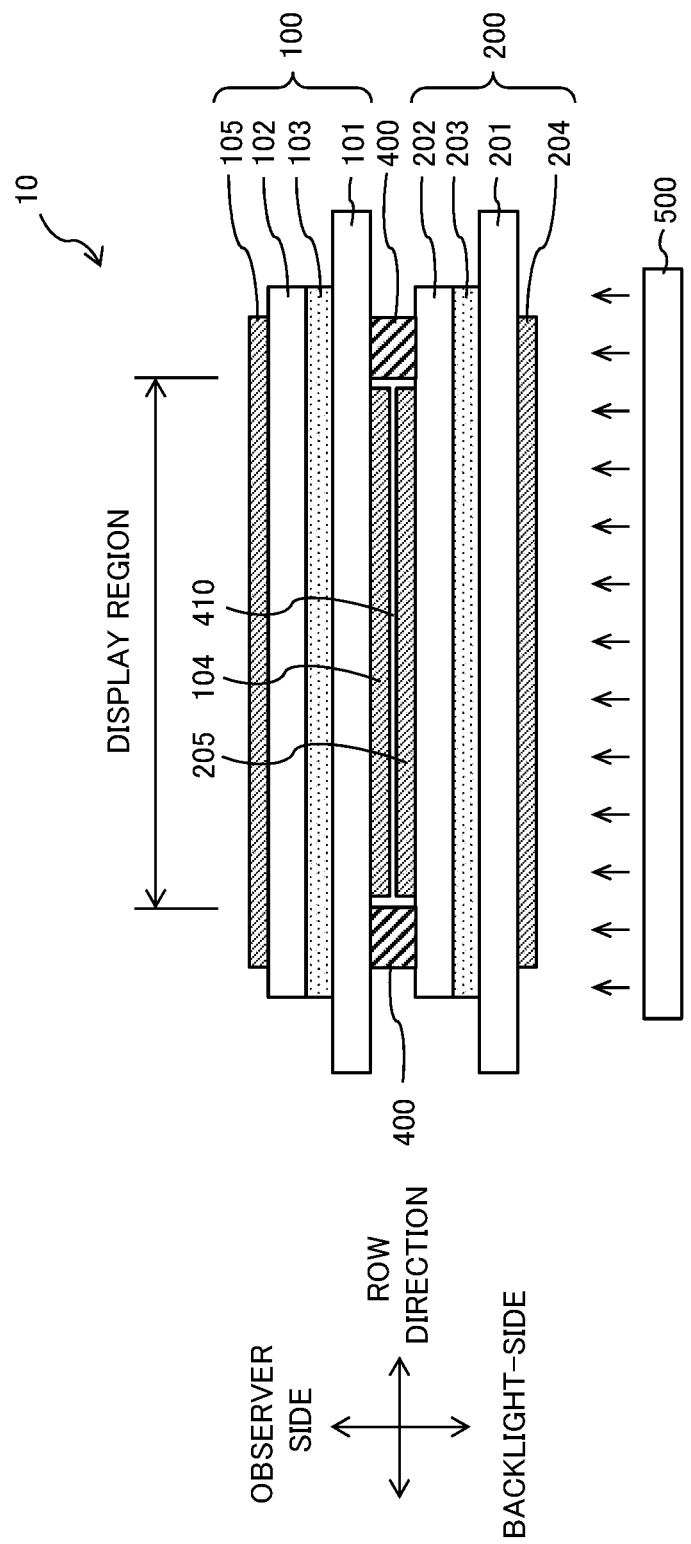
FIG. 9 is a sectional view illustrating liquid crystal display device according to the second exemplary embodiment.

FIG. 9 is a sectional view illustrating liquid crystal display device 10 according to the second exemplary embodiment. Liquid crystal display device 10 of the second exemplary embodiment differs from liquid crystal display device 10 (see FIG. 5) of the first exemplary embodiment in the configurations of polarizing plates 104, 205 and bonding layer 400 and the other configuration is the same as that of the first exemplary embodiment.

Figure 10:
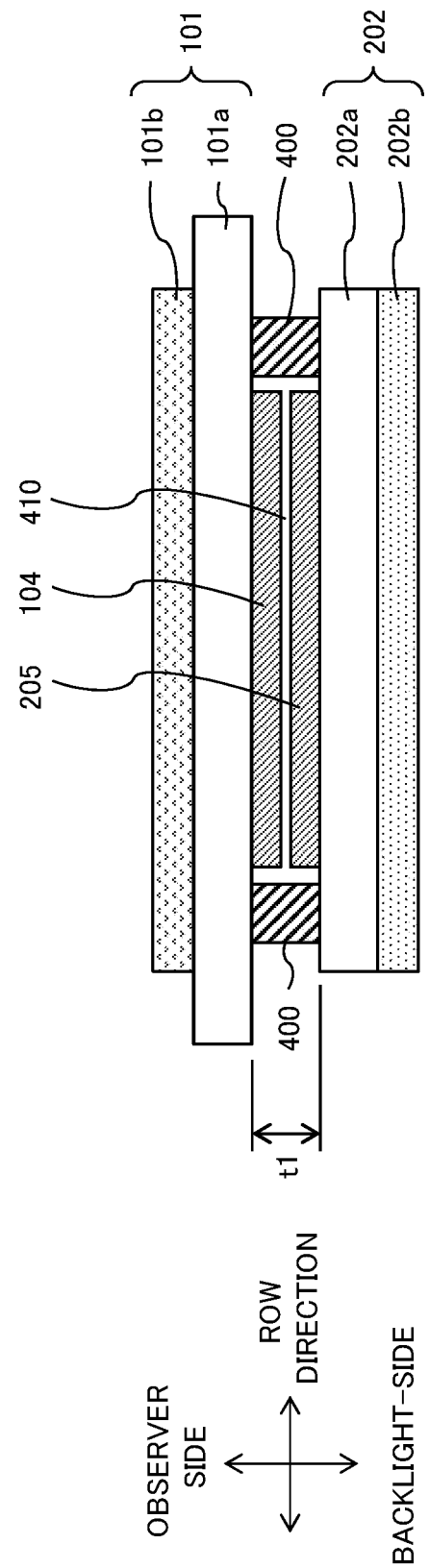
FIG. 10 is a view illustrating a stuck portion of display panel 100 and display panel 200 of the second exemplary embodiment.

FIG. 10 is a view illustrating a stuck portion of display panel 100 and display panel 200 of the second exemplary embodiment. In liquid crystal display device 10 of the second exemplary embodiment, bonding layer 400 is the outer peripheral end between glass substrate 101a of display panel 100 and glass substrate 202a of display panel 200, and is disposed in a region outside polarizing plates 104, 205. Polarizing plates 104, 205 are disposed in the region surrounded by bonding layer 400, and air gap 410 (gap) is formed between polarizing plates 104, 205. Thickness t1 of bonding layer 400 is larger than a total of thicknesses of polarizing plates 104, 205. For example, in the case that the double sided tape is used as bonding layer 400, thickness t1 of the double sided tape can be set to 0.6 mm, and the thickness of each of polarizing plates 104, 205 can be set to 0.26 mm. In the process of sticking display panel 100 and display panel 200, one of the surfaces of the double sided tape (bonding layer 400) is stuck to the outer peripheral end outside polarizing plate 205 in the surface on the observer side of glass substrate 202a of display panel 200, and the other surface of the double sided tape is stuck to the outer peripheral end outside polarizing plate 104 in the surface on the backlight side of glass substrate 101a while display panel 100 is overlapped. Consequently, glass substrate 101a, 202a are stuck to each other with bonding layer 400 interposed therebetween, thereby fixing display panel 100 and display panel 200.

In the above configuration, the cost can be reduced similarly to the first exemplary embodiment. In the above configuration, a distance (air gap 410) between display panel 100 and display panel 200 can be narrowed compared with the first exemplary embodiment (see FIG. 7). Thus, a problem of a display defect (for example, the display image is seen double) caused by the large distance of air gap 410 can be suppressed. Thickness t1 of bonding layer 400 can be thickened larger than the total of the thicknesses of polarizing plates 104, 205 compared with the first exemplary embodiment, and bonding layer 400 can be bonded to a glass surface having excellent flatness. Consequently, the bonding strength (adhesive strength) can be improved, and sticking force between display panel 100 and display panel 200 can be improved.

In the configuration of the second exemplary embodiment, because air gap 410 is narrowed, polarizing plates 104, 205 may come into partial contact with each other due to a warp of display panels 100, 200 or polarizing plates 104, 205 In the case that polarizing plates 104, 205 come into partial contact with each other, light interferes with each other (Newton ring) at a boundary between a contact portion and a non-contact portion, and the image quality may be degraded.

Figure 11:
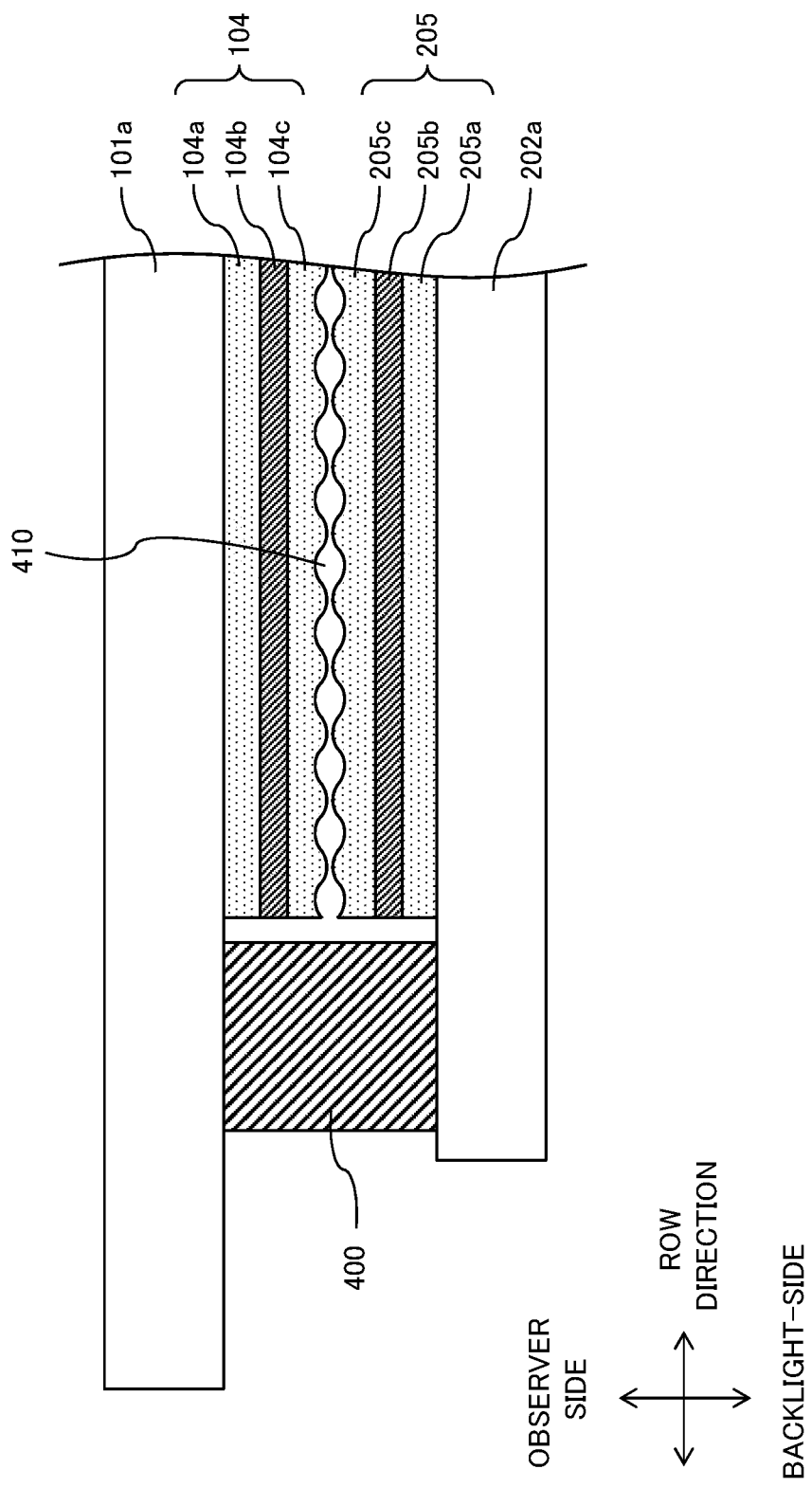
FIG. 11 illustrates a part of the enlarged stuck portion between display panel 100 and display panel 200.

For this reason, in liquid crystal display device 10 of the second exemplary embodiment, surfaces of polarizing plates 104, 205 facing each other, namely, the surface facing polarizing plate 205 in polarizing plate 104 and the surface facing polarizing plate 104 in polarizing plate 205 are subjected to surface roughening (anti-glare treatment) to form minute irregularities as illustrated in FIG. 11. FIG. 11 illustrates a part of the enlarged stuck portion between display panel 100 and display panel 200. Polarizing plate 104 includes triacetylcellulose (TAC) layers 104a, 104c of a substrate film and polarizing layer 104b (PVA layer) of a polarizing film (polarizer) disposed between TAC layers 104a, 104c. Similarly, polarizing plate 205 includes TAC layers 205a, 205c of a substrate film and polarizing layer 205b (PVA layer) of a polarizing film (polarizer) disposed between TAC layers 205a, 205c. Although not illustrated, each of polarizing plates 104, 205 includes a protective film and an adhesive (release film).

As illustrated in FIG. 11, the surface facing TAC layer 205c in TAC layer 104c and the surface facing TAC layer 104c in TAC layer 205c are subjected to the surface roughening to form the minute irregularities. A known method such as sand blasting and embossing can be adopted to the surface roughening. Alternatively, a binder resin layer containing fine particles may be formed. At this point, preferably refractive indices of the fine particle and the binder are substantially equalized to each other in order to decrease diffusion of light. In the above configuration, even if air gap 410 is narrowed, the contact portions of the surfaces facing each other in polarizing plates 104, 205 are dispersed, so that the light interference can be suppressed. The surface roughening may be performed on both the surface of polarizing plate 104 and the surface of polarizing plate 205 or only one of the surface of polarizing plate 104 and the surface of polarizing plate 205.

Figure 12:
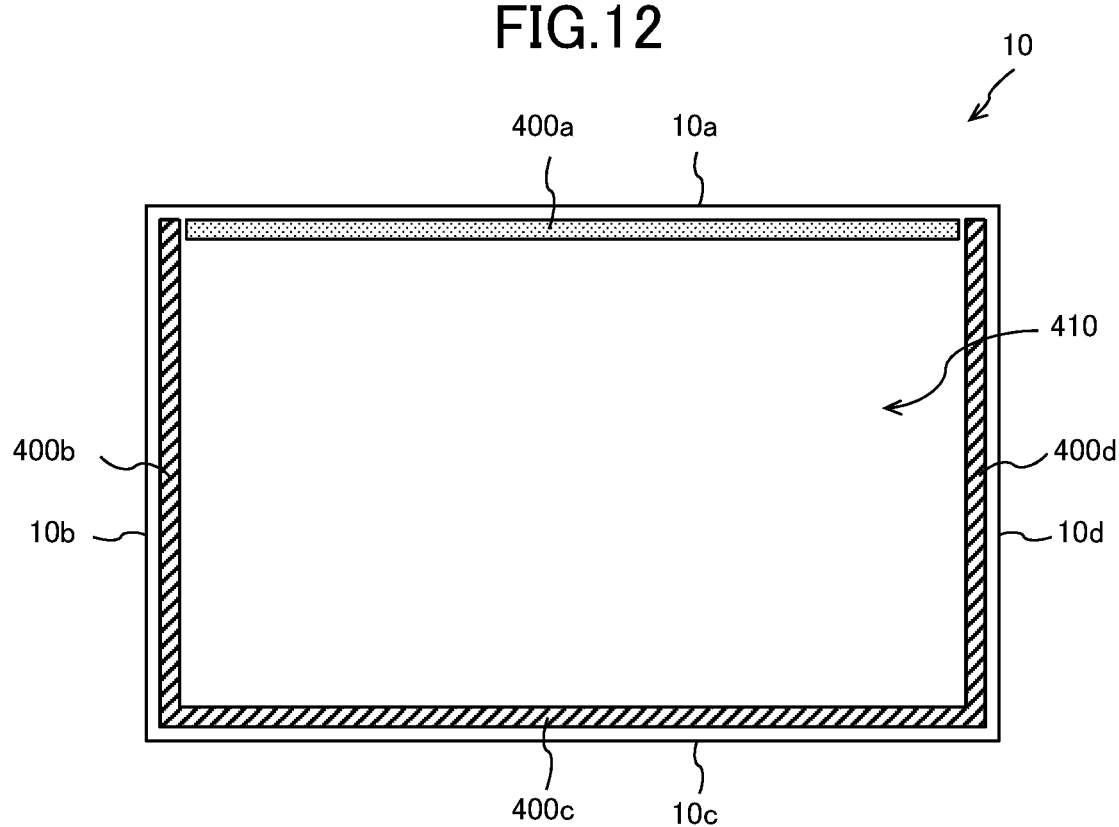
FIG. 12 is a plan view illustrating another schematic configuration of display panel of each exemplary embodiment.

Liquid crystal display device 10 of the present disclosure is not limited to the above configurations. For example, as illustrated in FIG. 12, a part (in this case, first portion 400a) of bonding layer 400 may be weaker than other portions (second portion 400b, third portion 400c, and fourth portion 400d) in the adhesive strength. For example, in the case that the double sided tape is used as bonding layer 400, after one of the surfaces of each of first portion 400a, second portion 400b, third portion 400c, and fourth portion 400d is stuck to glass substrate 202a of display panel 200, a release paper on the other surface is peeled off only in first portion 400a, and release papers on the other surface of each of second portion 400b, third portion 400c, and fourth portion 400d are left. Then, the other surface of first portion 400a is stuck to one side (a side corresponding to upper side 10a of liquid crystal display device 10) of glass substrate 101a while display panel 100 is overlapped. At this point, display panel 100 and display panel 200 are stuck only at one side, so that display panels 100, 200 can be aligned with each other. After display panel 100 and display panel 200 are aligned with each other, the release papers of second portion 400b, third portion 400c, and fourth portion 400d are peeled off, and second portion 400b, third portion 400c, and fourth portion 400d are stuck to the remaining three sides of glass substrate 101a. Consequently, display panel 100 and display panel 200 are stuck and fixed by bonding layer 400. In the above configuration, display panel 100 and display panel 200 can accurately be aligned with each other. Because a part of bonding layer 400 has the weak adhesive strength, display panel 100 and display panel 200 are easily peeled off, and workability can be improved during repair.

Figure 13:
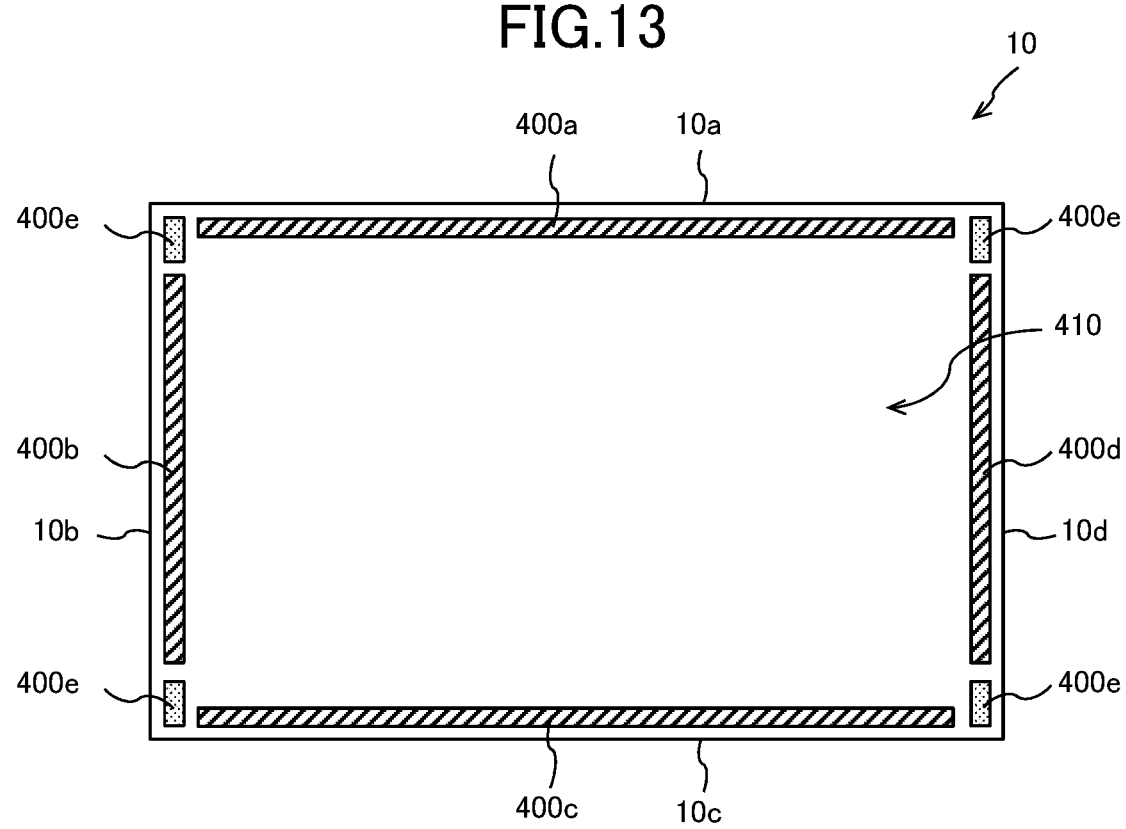
FIG. 13 is a plan view illustrating another schematic configuration of display panel of each exemplary embodiment.

There is no limitation on a place and the number of the portions where bonding layer 400 has the weak adhesive strength. For example, as illustrated in FIG. 13, fifth portion 400e having weaker adhesive strength than first portion 400a, second portion 400b, third portion 400c, and fourth portion 400d may be disposed at positions corresponding to four corners of liquid crystal display device 10.

Figure 14:
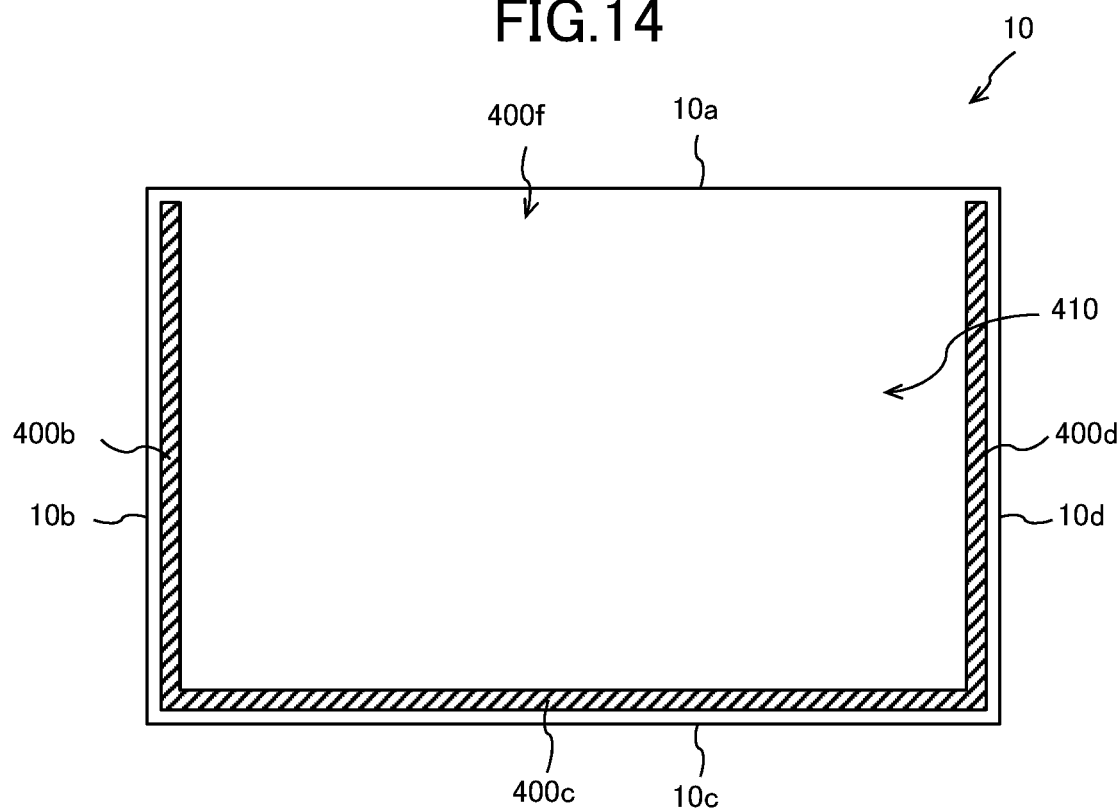
FIG. 14 is a plan view illustrating another schematic configuration of display panel of each exemplary embodiment.

For example, as illustrated in FIG. 14, a part (in this case, first portion 400a) of bonding layer 400 may be eliminated as another configuration of liquid crystal display device 10. That is, opening 400f may be formed in a part of bonding layer 400. In this configuration, the region (air gap 410) between display panel 100 and display panel 200 is not closed, but the air can flow in and out, so that peel-off of the bonding between display panel 100 and display panel 200 due to thermal expansion of the air in the region can be prevented.

Figure 15:
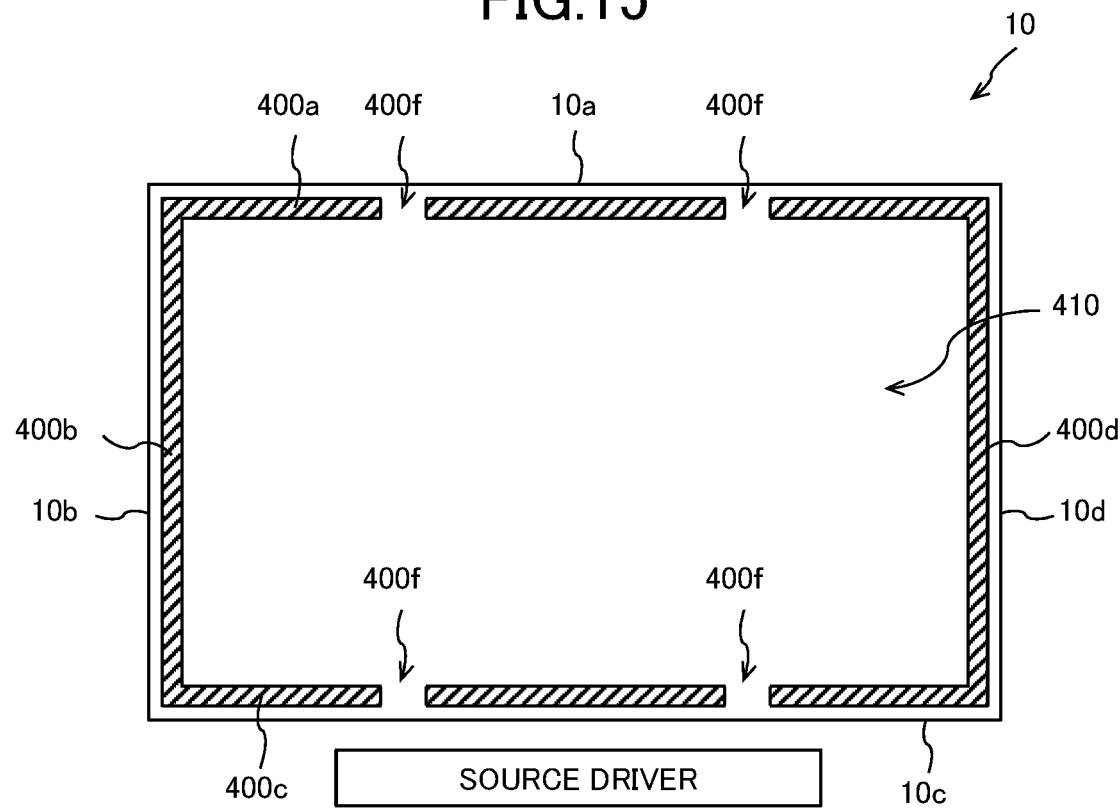
FIG. 15 is a plan view illustrating another schematic configuration of display panel of each exemplary embodiment.

In the configuration of FIG. 14, opening 400f may further be formed in a portion on the side where a driving circuit (such as the source driver and the gate driver) is disposed in bonding layer 400 and an opposite portion to the portion. In an example of FIG. 15, openings 400f are formed in third portion 400c on the side (lower side 10c) where the source driver is disposed and first portion 400a on the opposite side (upper side 10a). In the above configuration, an air flow is generated in the region (air gap 410) between display panel 100 and display panel 200, so that a heat radiation effect for liquid crystal display device 10 can be obtained. In the above configuration, opening 400f may be provided in at least one point of each two sides facing each other, but there is no limitation on the number of openings 400f.

Figure 16A:
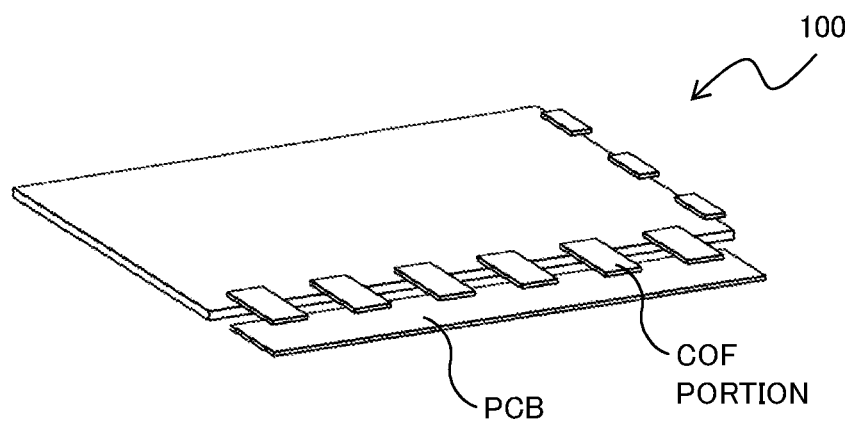
FIGS. 16A and 16B are plan views illustrating another schematic configuration of display panel of each exemplary embodiment.
Figure 16B:
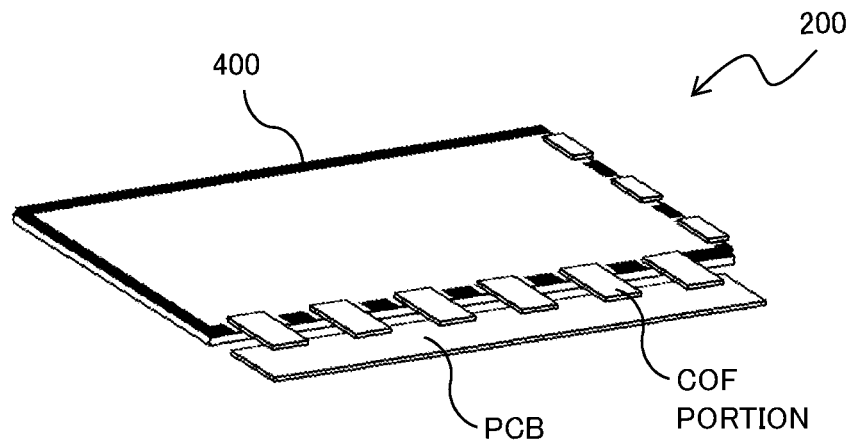
Figure 17A:
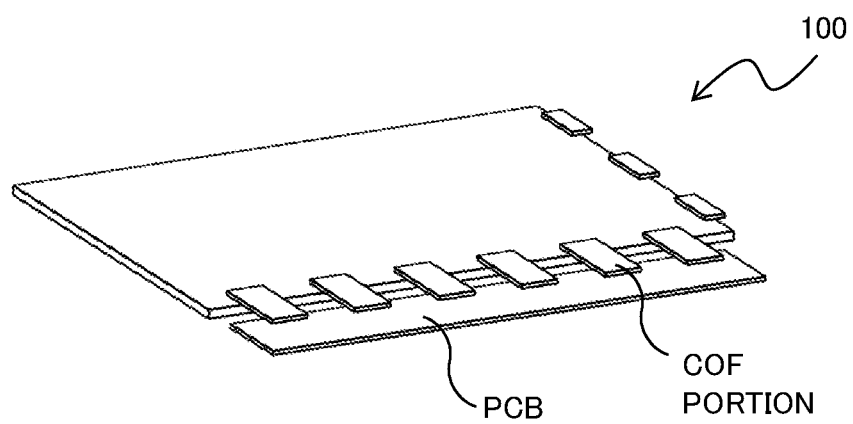
FIGS. 17A and 17B are plan views illustrating another schematic configuration of display panel of each exemplary embodiment.
Figure 17B:
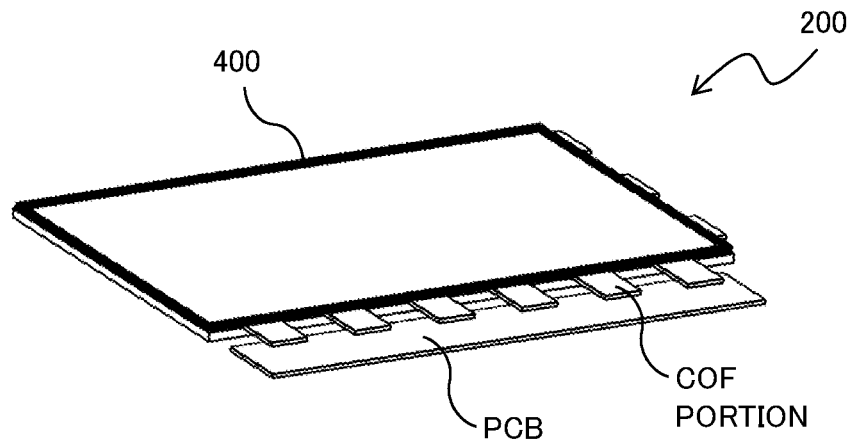

As to another configuration of liquid crystal display device 10, for example, as illustrated in FIGS. 16A and 16B, bonding layer 400 may be disposed in a region where a chip on film (COF) portion of display panel 200 is avoided (FIG. 16B), and stuck to display panel 100 (FIG. 16A). In the configuration of FIGS. 16A and 16B, the double sided tape may be used as bonding layer 400. However, preferably a silicone resin based bonding agent is used in consideration of workability. As illustrated in FIGS. 17A and 17B, bonding layer 400 may be disposed in a whole periphery of display panel 200 so as to cover an upper portion of the COF portion of display panel 200 (FIG. 17B), and stuck to display panel 100 (FIG. 17A). In the configuration of FIGS. 16A and 16B, the double sided tape may be used as bonding layer 400. However, preferably the silicone resin based bonding agent is used in consideration of a step of the COF portion and the like.

While there have been described what are at present considered to be certain embodiments of the application, it will be understood that various modifications may be made thereto, and it is intended that the appended claims cover all such modifications as fall within the true spirit and scope of the invention.

What is claimed is:

1. A display device, comprising:
a first display panel;
a second display panel disposed opposite to the first display panel;
a first polarizing plate disposed on the first display panel, the first polarizing plate being disposed between the first display panel and the second display panel; and
a bonding layer disposed between the first display panel and the second display panel to bond the first display panel and the second display panel,
wherein in planar view, the bonding layer overlaps outer peripheral ends of the first polarizing plate, and
a surface of the bonding layer bonds to a surface of the first polarizing plate, with an area between the first polarizing plate and the second display panel that corresponds to a display region of the first display panel being free of bonding material.

2. The display device according to claim 1, further comprising:
a second polarizing plate disposed on the second display panel, the second polarizing plate being disposed between the first display panel and the second display panel, wherein
in planar view, the bonding layer overlaps outer peripheral ends of the second polarizing plate without overlapping a display region of the second display panel, and
a surface of the bonding layer bonds to a surface of the second polarizing plate.

3. The display device according to claim 2, wherein a gap is formed between the first polarizing plate and the second polarizing plate.

4. The display device according to claim 1, wherein the bonding layer includes a first portion and a second portion having weaker adhesive strength than the first portion.

5. The display device according to claim 1, wherein an opening is formed in a part of the bonding layer.

6. The display device according to claim 1, wherein each of the display panels includes a chip on film (COF) portion, and the bonding layer is disposed in a region where the COF portion is avoided in planar view.

7. The display device according to claim 1, wherein
the first display panel includes:
a first glass substrate;
a second glass substrate disposed opposite to the first glass substrate, and
a first liquid crystal layer disposed between the first glass substrate and the second glass substrate,
the second display panel includes:
a third glass substrate;
a fourth glass substrate disposed opposite to the third glass substrate, and
a second liquid crystal layer disposed between the third glass substrate and the fourth glass substrate, and
the first glass substrate, the second glass substrate, the third glass substrate and the fourth glass substrate are stacked in this order.

8. The display device according to claim 7, further comprising a second polarizing plate disposed on the second display panel, the second polarizing plate being disposed between the first display panel and the second display panel, wherein
in planar view, the bonding layer overlaps outer peripheral ends of the second polarizing plate without overlapping a display region of the second display panel, and
a surface of the bonding layer bonds to a surface of the second polarizing plate, wherein
an area of the first polarizing plate is smaller than an area of the second glass substrate, and
the area of the second polarizing plate is smaller than an area of the third glass substrate.

9. The display device according to claim 1, wherein the area of the first polarizing plate is larger than the area surrounded by the bonding layer.

10. The display device according to claim 2, wherein
the area of the second polarizing plate is larger than the area surrounded by the bonding layer.

11. The display device according to claim 1, further comprising:
a second polarizing plate disposed on the first display panel, the first display panel being disposed between the first polarizing plate and the second polarizing plate.

12. The display device according to claim 1, further comprising:
a second polarizing plate disposed on the second display panel, the second display panel being disposed between the first polarizing plate and the second polarizing plate.

13. The display device according to claim 2, further comprising:
a third polarizing plate disposed on the first display panel, the first display panel being disposed between the first polarizing plate and the third polarizing plate, and
a fourth polarizing plate disposed on the second display panel, the second display panel being disposed between the second polarizing plate and the fourth polarizing plate.

14. The display device according to claim 1, wherein an area between the first display panel and the second display panel that corresponds to a display region of the first display panel is free of bonding material.

15. The display device according to claim 14, further comprising:
a second polarizing plate disposed on the second display panel, the second polarizing plate being disposed between the first display panel and the second display panel, wherein
in planar view, the bonding layer overlaps outer peripheral ends of the second polarizing plate without overlapping a display region of the second display panel, and
a surface of the bonding layer bonds to a surface of the second polarizing plate.

16. A display device, comprising:
a first display panel;
a second display panel disposed opposite to the first display panel;
a first polarizing plate disposed on the first display panel, the first polarizing plate being disposed between the first display panel and the second display panel;
a second polarizing plate disposed on the second display panel, the second polarizing plate being disposed between the first display panel and the second display panel; and
a bonding layer disposed between the first display panel and the second display panel to bond the first display panel and the second display panel,
wherein in planar view, the bonding layer overlaps outer peripheral ends of the first polarizing plate, and
a surface of the bonding layer bonds to a surface of the first polarizing plate, with an area between the first polarizing plate and the second polarizing plate that corresponds to a display region of the first display panel being free of bonding material.

* * * * *